(12) United States Patent
Benante

(10) Patent No.: US 8,424,199 B1
(45) Date of Patent: Apr. 23, 2013

(54) SEMICONDUCTOR CHIP MOUNTING SYSTEM

(75) Inventor: Anthony F. Benante, Scottsdale, AZ (US)

(73) Assignee: On-Shore Technology, Inc., Tempe, AZ (US)

( * ) Notice: Subject to any disclaimer, the term of this patent is extended or adjusted under 35 U.S.C. 154(b) by 0 days.

(21) Appl. No.: 13/396,042

(22) Filed: Feb. 14, 2012

(51) Int. Cl.
*H05K 3/30* (2006.01)

(52) U.S. Cl.
USPC ............................................. 29/760

(58) Field of Classification Search .......... 29/739–741, 29/760; 439/70, 71
See application file for complete search history.

(56) References Cited

U.S. PATENT DOCUMENTS

| | | | |
|---|---|---|---|
| 4,433,886 A * | 2/1984 | Cassarly et al. | 439/65 |
| 4,816,426 A | 3/1989 | Bridges et al. | |
| 4,970,781 A | 11/1990 | Chang et al. | |
| 5,176,254 A | 1/1993 | Caravona | |
| 6,168,454 B1 * | 1/2001 | Dzwonczyk | 439/381 |

* cited by examiner

*Primary Examiner* — Livius R Cazan
(74) *Attorney, Agent, or Firm* — Cahill Glazer PLC

(57) ABSTRACT

A circuit chip mounting system incorporates a carrier having a socket for receiving a circuit chip. The socket includes a plurality of contacts for contacting pads on the chip and includes pins extending therefrom for insertion into terminals in a PCB. Secondary spacers each having a configuration corresponding to a portion of the shape of the carrier are provided with holes arranged to receive the pins and permit the pins to pass therethrough for insertion in PCB terminals. The secondary spacers are soluble to be removed in a washing procedure during processing.

4 Claims, 1 Drawing Sheet

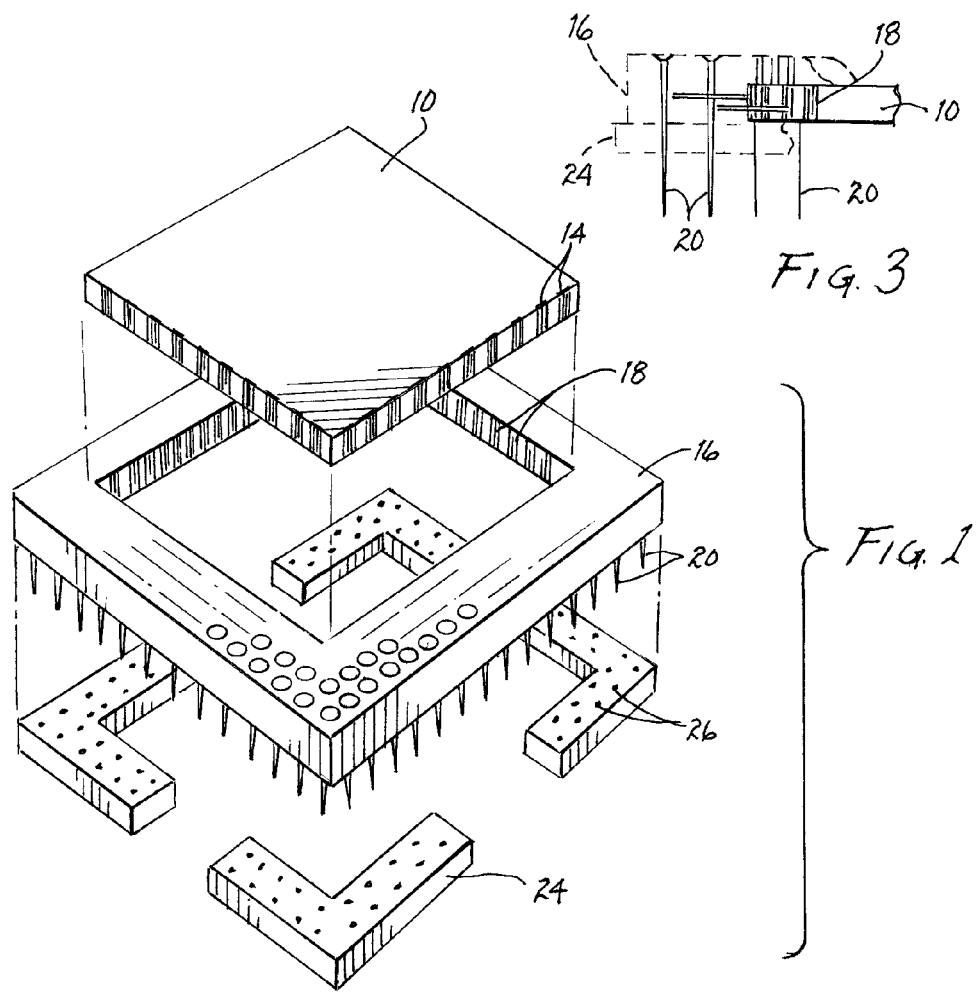
Fig. 3
Fig. 1
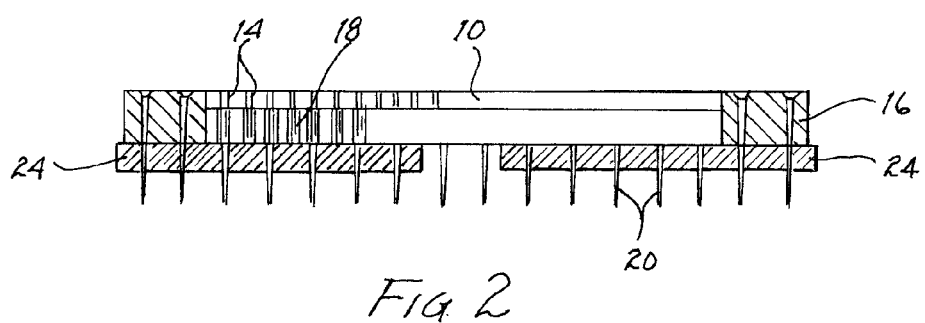
Fig. 2

SEMICONDUCTOR CHIP MOUNTING SYSTEM

FIELD OF THE INVENTION

The present invention relates to circuit board assembly and more particularly to the technology relating to the mounting of integrated circuit semiconductor chips on printed wiring boards.

BACKGROUND OF THE INVENTION

The interconnection of semiconductor circuit chips with other components in an electronic system has evolved into a complex array of processes for the accurate and secure placement of circuit chips on PCBs to provide interconnection between chips, components and other elements of the electronic system of which the chip is a part. Further, the automated process implemented for mounting the chip to the PCB must accommodate the requirements of the circuit chip such that the mounting must not only be accurate and secure, but must also provide for cooling air to flow over the circuit chip to maintain proper operating temperature of the chip during its operation. The micro-miniaturization of the circuits implemented in the circuit chips together with the power requirements of the various operating circuits dictate that cooling airflow over the surfaces of the chip is critical to the performance and longevity of the chip and the remainder of the system. The latter requirement is particularly true in applications of micro-miniaturization required in small computing and/or communicating devices such as cell phones, pads and tablets as well as laptop computers.

One of the prior art techniques for securing components to a PCB is described in U.S. Pat. No. 5,176,254 together with the prior art discussed therein. This described technique contemplates the utilization of a water soluble spacer to support electronic components during the soldering process to secure the component to the PCB. The water soluble component is subsequently dissolved thus providing an air space between the PCB and the component.

SUMMARY OF THE INVENTION

The present invention incorporates the utilization of water soluble materials for the mounting and positioning of a circuit chip on a printed circuit board; however, in view of the varying requirements of various circuit chips, and the varying heat loads resulting from their use, the spacing of the circuit chip from its ultimately supporting printed circuit board may vary and sometimes require greater spacing from the PCB. Supplemental water soluble spacers having predetermined configurations and prescribed positions with respect to a water soluble carrier are employed to accommodate the circuit chip's heat load during operation.

BRIEF DESCRIPTION OF THE DRAWINGS

The present invention may more readily be described by reference to the accompanying drawings in which:

FIG. 1 is an exploded isometric view of a circuit chip mounting system constructed in accordance with the teachings of the present invention.

FIG. 2 is a side elevational view of the system of FIG. 1, partly in section.

FIG. 3 is a schematic illustration, partly in section, of the interconnection between pads on the periphery of a circuit chip with pins secured within a carrier useful for describing the system of the present invention.

DETAILED DESCRIPTION OF THE INVENTION

Referring to the drawings, a semiconductor circuit chip 10 is shown positioned for insertion in a socket of a carrier. The semiconductor chip 10 is formed as illustrated in a square; however, other shapes may be found in the industry and are equally applicable for use in the present system. The circuit chip 10 contains an operating circuit including active and passive components as well as interconnections thereto. Electrical connection to the circuitry of the circuit chip 10 is achieved through a plurality of conductive pads 14 positioned about the periphery of the chip 10. Each of the pads electrically communicate to the circuits within the chip as is well known in the art. The chip 10 is configured for insertion into a socket 12 of a carrier 16 and to be maintained in the inserted position. The carrier 16 is formed into a predetermined shape; in the embodiment chosen for illustration, the shape is a square. Other shapes may be chosen for a variety of reasons such as the shape and number of circuit chips to be supported by the carrier. The socket 12 of the carrier 16 is lined with a plurality of contacts 18, each positioned for contact with a corresponding pad 14 of the circuit chip 10 when the latter is inserted in the socket 12. Electrical connection is thus achieved between the circuit chip 10, the pads 14 about the periphery of the chips, and the corresponding contact 18 that is in registration with the respective pads 14.

Internal electrical connections within the carrier 16 are made between the contacts 18 and a plurality of pins 20 extending therefrom. Such carrier systems providing contact from semiconductor chip pads through contacts in a carrier to pins internally within the carrier are well known in the art and need not be described here. FIG. 3 is a schematic representation of the interconnection between a contact 18 positioned at the interior of the socket 12 of the carrier 16 and a respective pin 20. It may be noted that while the contacts 18 form single rows of contacts along each side of the socket 12, the interconnection between the contacts and the corresponding pins 20 results in a two dimensional array of pins that may be arranged in any geometric pattern and may be formed into two or more pin rows. Thus, the pins 20 extending from the carrier 16 form a predetermined two dimensional pattern to provide adequate spacing between the pins 20 for insertion into corresponding terminals of the PCB upon which the circuit chip 10 is to be mounted. The pins 20 are firmly held by the carrier 16 and are thus electrically interconnected to selected pads 14 through corresponding contacts 18 positioned within the socket 12 of the carrier 16. The pins 20 are thus arranged in a predetermined pattern extending downwardly (as shown in the drawings) for insertion into corresponding terminals in a printed circuit board and to ultimately be secured by soldering to the PCB. As shown in the drawings, the socket 12 is an opening conforming to the outline of the circuit chip 10 and extends through the carrier 16; however, it is typical to provide an enclosed bottom to the socket 12 so that the socket "bottoms" against such lower surface to insure proper orientation with respect to the carrier contacts 18.

The carrier 16 therefore acts as a spacer to position the chip 10 above the PCB; however, when modification of the spacing is required between a printed circuit board surface and the circuit chip to accommodate different cooling loads, the simple requirement of varying the thickness of the carrier presents difficulties during the assembly and soldering process. If the carrier 16 is required to space the circuit chip 10 a predetermined distance from the PCB surface, and this distance is increased as a result of an increasing heat load presented to the system because of the requirements of the integrated circuit on the circuit chip, the carrier becomes too thick for the efficient removal of the soluble carrier after the pins are secured to the PCB. That is, the mass of the material presented by the water soluble carrier requires excessive time for its rapid dissolution during processing of the chip/PCB. To yield a circuit chip supported above the surface of a PCB an adequate distance for the volume of air required for cooling the chip, the removal process must not only insure the proper spacing, but must be accomplished in a timely and efficient manner. Further, during the design process, the required spacing from the circuit chip to the PCB surface may not be known until the chip and PCB have been assembled and the system tested. The heat generated by the circuit chip under certain load conditions may be difficult to determine and may ultimately be derived empirically. Under such circumstances, the design and implementation of carrier manufacturing techniques may produce a standardized or fixed thickness of the carrier while secondary spacers 24 may readily be produced in appropriate additional thicknesses for combination with the carrier 16 to provide the required spacing between the PCB surface and the circuit chip 10 to provide sufficient cooling for the heat load that has been empirically determined.

The present invention incorporates a plurality of secondary spacers 24 each having a predetermined configuration corresponding to the shape of a portion of the carrier 16 and each incorporating a plurality of pin receiving holes 26 arranged in a pattern corresponding to the pattern of pins 20 extending from the carrier 16 at the predetermined location. It is important to note that the pin pattern/positioning is secured by the carrier 16 and that the pin receiving holes 26 in the secondary spacers 24, when aligned to correspond to the pattern of pins, are of sufficient diameter to avoid contact with pins extending therethrough. The thickness of the secondary spacers 24 is less than the length of the pins extending from the carrier 16 so that, when the secondary spacers 24 are positioned in contact with the carrier 16, the pins 20 extend beyond the secondary spacers 24 a sufficient distance to be inserted in corresponding terminals in a PCB in a manner well known in the art. Thus, the combined mass of the plurality of secondary spacers 24 and the carrier 16, is significantly less than the mass of a carrier having a thickness chosen to provide the same air space between a PCB surface and the circuit chip 10. The reduction in the total mass of material to be removed by the subsequent dissolving procedure increases the speed and efficiency of the mounting process.

The material for forming the carrier 16 and the secondary spacers 24 may comprise commercially available compounds. These materials may typically be molded into rigid forms that, in the case of the carrier, can receive and rigidly support pins 20 and maintain the pins 20 in a fixed rigid spatial configuration for handling and processing. These materials are subsequently removed by washing operations that dissolve the material leaving the pins 20 firmly secured to the PCB while supporting the circuit chip 10 displaced from the surface of the PCB to permit cooling air flow between the chip and the PCB surface.

The present invention has been described in terms of selected specific embodiments of the apparatus and method incorporating details to facilitate the understanding of the principles of construction and operation of the invention. Such reference herein to a specific embodiment and details thereof is not intended to limit the scope of the claims appended hereto. It will be apparent to those skilled in the art that modifications may be made in the embodiments chosen for illustration without departing from the spirit and scope of the invention.

What is claimed:

1. A circuit chip mounting system comprising:
    (a) a soluble carrier having a predetermined shape and having a socket for receiving a circuit chip therein, said circuit chip having a plurality of pads electrically connected to a circuit on said chip;
    (b) said carrier having a plurality of contacts in said socket for contacting respective pads when said circuit chip is positioned in said socket;
    (c) said carrier rigidly supporting a plurality of pins extending therefrom arranged in a predetermined pattern, each pin electrically connected to a respective pad;
    (d) a plurality of soluble secondary spacers each having a configuration corresponding to a portion of the shape of said carrier; and
    (e) each spacer having a plurality of holes arranged in a pattern corresponding to a portion of the predetermined pin pattern of the carrier to receive pins therethrough from the carrier, said holes each having a sufficient diameter to avoid contact with pins extending therethrough.

2. The chip mounting system of claim 1 wherein said carrier is constructed of water soluble material.

3. A circuit chip mounting system for mounting a circuit chip to a printed circuit board to provide an air space between the circuit chip and the printed circuit board, said system comprising:
    (a) a soluble carrier having a predetermined shape and mass having a socket for receiving a circuit chip therein, said circuit chip having a plurality of pads electrically connected to a circuit on said chip;
    (b) said carrier having a plurality of contacts in said socket for contacting respective pads when said circuit chip is positioned in said socket;
    (c) said carrier rigidly supporting a plurality of pins extending therefrom arranged in a predetermined pattern, each pin electrically connected to a respective pad;
    (d) a plurality of soluble secondary spacers each having mass and a configuration corresponding to a portion of the shape of said carrier; and
    (e) each spacer having a plurality of holes arranged in a pattern corresponding to a portion of the predetermined pin pattern of the carrier to receive pins therethrough from the carrier, said holes each having a sufficient diameter to avoid contact with pins extending therethrough; and
    (f) the combined mass of said carrier and said plurality of secondary spacers is less than the mass of a carrier having a thickness chosen to provide the same air space.

4. The chip mounting system of claim 3 wherein said carrier is constructed of water soluble material.

* * * * *